United States Patent
Cho et al.

(10) Patent No.: US 8,400,831 B2
(45) Date of Patent: Mar. 19, 2013

(54) METHOD AND APPARATUS FOR IMPROVING ENDURANCE OF FLASH MEMORIES

(75) Inventors: Hoon Cho, Santa Clara, CA (US); Kiran Pangal, Fremont, CA (US); Krishna K. Parat, Palo Alto, CA (US); Neal R. Mielke, Los Altos Hills, CA (US); Pranav Kalavade, San Jose, CA (US); Iwen Chao, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 169 days.

(21) Appl. No.: 12/955,765

(22) Filed: Nov. 29, 2010

(65) Prior Publication Data

US 2012/0137048 A1 May 31, 2012

(51) Int. Cl.
*G11C 16/04* (2006.01)
(52) U.S. Cl. ............................... 365/185.17; 365/185.33
(58) Field of Classification Search ............. 365/185.17, 365/185.33, 185.18, 185.25
See application file for complete search history.

(56) References Cited

U.S. PATENT DOCUMENTS

| | | | | |
|---|---|---|---|---|
| 2002/0012275 A1* | 1/2002 | Ahn et al. | ................. | 365/185.33 |
| 2008/0084737 A1* | 4/2008 | Tang et al. | ................. | 365/185.3 |
| 2010/0261317 A1* | 10/2010 | Lutze et al. | ................... | 438/128 |

* cited by examiner

*Primary Examiner* — Vu Le
(74) *Attorney, Agent, or Firm* — Blakely, Sokoloff, Taylor & Zafman LLP

(57) ABSTRACT

A method and apparatus for improving the endurance of flash memories. In one embodiment of the invention, a high electric field is provided to the control gate of a flash memory module. The high electric field applied to the flash memory module removes trapped charges between a control gate and an active area of the flash memory module. In one embodiment of the invention, the high electric field is applied to the control gate of the flash memory module prior to an erase operation of the flash memory module. By applying a high electric field to the control gate of the flash memory module, embodiments of the invention improve the Program/Erase cycling degradation of the single-level or multi-level cells of the flash memory module.

16 Claims, 5 Drawing Sheets

METHOD AND APPARATUS FOR IMPROVING ENDURANCE OF FLASH MEMORIES

FIELD OF THE INVENTION

This invention relates to flash memories, and more specifically but not exclusively, to a method and apparatus for improving the endurance of flash memories.

BACKGROUND DESCRIPTION

Flash memories such as NAND and NOR flash memories have a limited useful life. The cells of the flash memories can be degraded with each programming and erasing operation. One possible cause of the Program/Erase (P/E) cycling degradation of the cells of the flash memories is the trapped charges induced by the cycling of programming and erasing operations.

The P/E cycling degradation of the flash memories includes a shift in the threshold voltage, $V_T$, poor $V_T$ distribution, a read margin loss of the multi-level cells and intrinsic charge loss etc.

BRIEF DESCRIPTION OF THE DRAWINGS

The features and advantages of embodiments of the invention will become apparent from the following detailed description of the subject matter in which.

DETAILED DESCRIPTION

Figure 1:
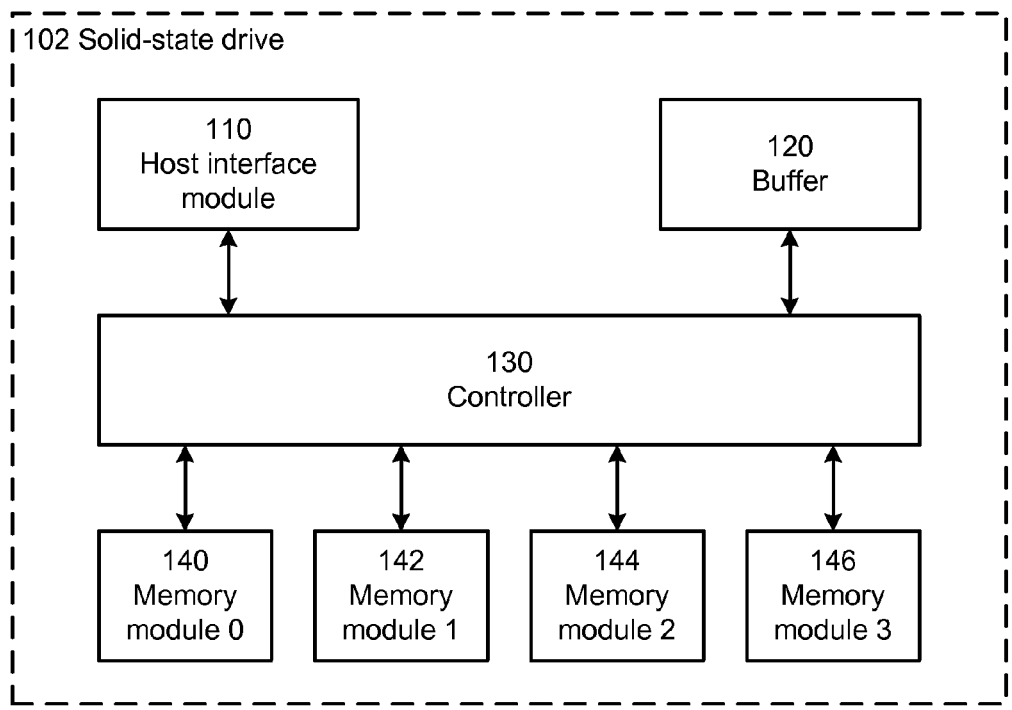
FIG. 1 illustrates a block diagram of a solid state drive in accordance with one embodiment of the invention.

Embodiments of the invention described herein are illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference numerals have been repeated among the figures to indicate corresponding or analogous elements. Reference in the specification to "one embodiment" or "an embodiment" of the invention means that a particular feature, structure, or characteristic described in connection with the embodiment is included in at least one embodiment of the invention. Thus, the appearances of the phrase "in one embodiment" in various places throughout the specification are not necessarily all referring to the same embodiment.

Embodiments of the invention provide a method and apparatus for improving the endurance or useful life time of flash memories. In one embodiment of the invention, a high electric field is provided to the control gate of a flash memory module. In one embodiment of the invention, the high electric field applied to the flash memory module removes trapped charges between a control gate and an active area of the flash memory module.

The high electric field is provided or generated using one or more voltage pulses in one embodiment of the invention. In one embodiment of the invention, the high electric field is applied to the control gate of the flash memory module prior to an erase operation of the flash memory module. By applying a high electric field to the control gate of the flash memory module, embodiments of the invention improve the P/E cycling degradation of the single-level or multi-level cells of the flash memory module. In one embodiment of the invention, the shift in the threshold voltage, the read margin loss and the intrinsic charge loss, of the cells in the flash memory module can be reduced or minimized.

FIG. 1 illustrates a block diagram 100 of a solid state drive (SSD) 102 in accordance with one embodiment of the invention. The SSD 102 has a host interface module 110, a buffer 120, a controller 130, and memory module 0 140, memory module 1 142, memory module 2 144, and memory module 3 146. In one embodiment of the invention, the host interface module 110 provides an interface to connect with a host device or system. The host interface module 110 operates in accordance with a communication protocol, including but not limited to, Serial Advanced Technology Attachment (SATA) Revision 1.x, SATA Revision 2.x, SATA Revision 3.x, and any other type of communication protocol.

The buffer 120 provides temporary storage to the SSD 102 in one embodiment of the invention. The buffer includes Synchronous Dynamic Random Access Memory (SDRAM), Dynamic Random Access Memory (DRAM), RAMBUS Dynamic Random Access Memory (RDRAM), and/or any other type of random access memory device.

The controller 130 has logic to facilitate the application or generation of one or more voltage pulses to the control gate of the memory modules 0-3 140, 142, 144, and 146 in one embodiment of the invention. The controller 130 is coupled with a voltage source (not shown) and enables or disables the voltage source to provide one or more voltage pulses to each of the memory modules 0-3 140, 142, 144, and 146. The voltage source includes, but is not limited to, a voltage regulator, a voltage generator, a voltage pump, an external voltage source and any other forms of providing a voltage.

In another embodiment of the invention, the memory modules 0-3 140, 142, 144, and 146 have logic to facilitate the application of one or more voltage pulses to the control gate of the memory modules 0-3 140, 142, 144, and 146. In one embodiment of the invention, the memory modules 0-3 140, 142, 144, and 146 include, but are not limited to, NAND flash memories, NOR flash memory, and the like.

In one embodiment of the invention, each of the memory modules 0-3 140, 142, 144, and 146 has one or more flash memory dies. The flash memory cells of the flash memory die are single-level cells in one embodiment of the invention. In another embodiment of the invention, the flash memory cells of the flash memory die are multi-level cells. The number of memory modules shown in FIG. 1 is not meant to be limiting. In other embodiments of the invention, there can be more or less than four memory modules.

Figure 2:
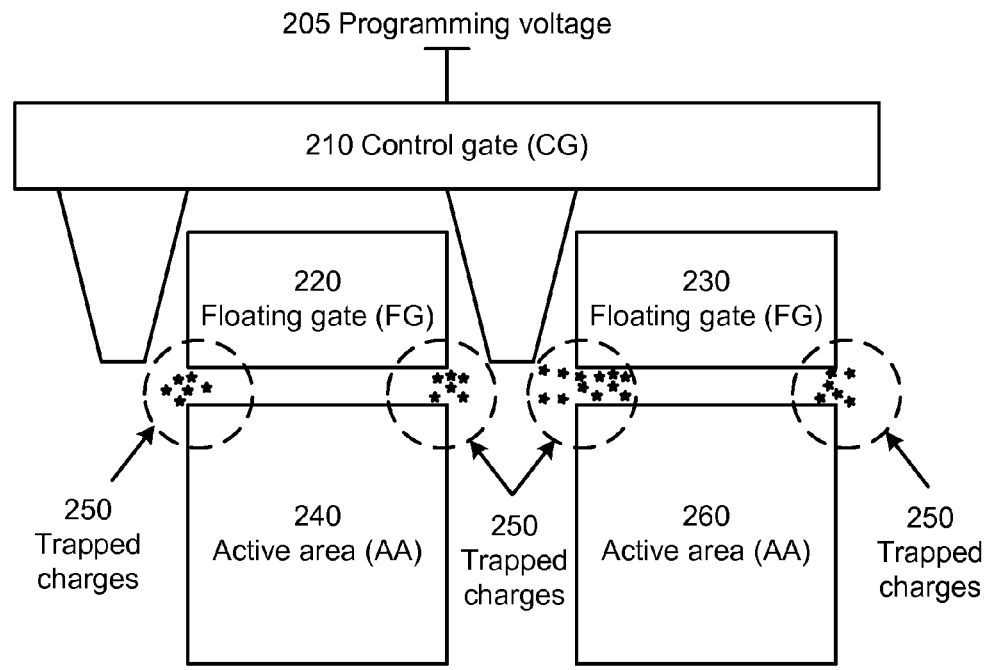
FIG. 2 illustrates a block diagram of a flash memory cell in accordance with one embodiment of the invention.

FIG. 2 illustrates a block diagram 200 of a flash memory cell in accordance with one embodiment of the invention. The flash memory cell has a control gate (CG) 210. For clarity of illustration, the trapped charges 250 are shown between the floating gate (FG) 220 and the active area (AA) 240 and between the FG 230 and the AA 260. The trapped charges may also reside in the tunnel oxide (not shown) that insulates the FGs from the substrate in one embodiment of the invention.

To remove the trapped charges, an electric field is applied to the control gate 210 of the flash memory cell in one embodiment of the invention. In one embodiment of the invention, a programming voltage pulse of the flash memory cell is applied to create the electric field. In one embodiment of the invention, one or more programming voltage pulses are applied to the control gate 210 of the flash memory cell prior to an erasing operation of the flash memory cell. In one embodiment of the invention, the pulse width of the programming voltage is a traditional programming pulse. In another embodiment of the invention, the pulse width of the programming voltage comprises multiple traditional programming pulses.

The configuration of the voltage pulse is not meant to be limiting and one of ordinary skill in the relevant art will readily appreciate other configurations of the voltage pulse can be used without affecting the workings of the invention. For example, the width of the voltage pulse may also be set to a width larger or smaller than the clock cycle of the SSD in one embodiment of the invention.

In another example, in one embodiment of the invention, the electric field is generated by applying a voltage pulse that has a higher voltage level than the programming voltage of the flash memory cell. In another embodiment of the invention, the electric field is generated by applying a voltage pulse that has a lower voltage level than the maximum programming voltage of the flash memory cell.

In one embodiment of the invention, the applied voltage pulse has a voltage level that is sufficient to remove the trapped charges of the flash memory cell but the voltage level should not be high enough to destroy or impact the performance of the flash memory cell. For example, in one embodiment of the invention, the voltage level of the voltage pulse cannot be set to a level that is higher than the absolute allowed voltage rating of the flash memory cell to avoid damaging the flash memory cell.

In one embodiment of the invention, one of ordinary skill in the relevant art may measure the distribution of the threshold voltage of the flash memory cells after the voltage pulse is applied to determine the appropriate configuration of the voltage pulse. One of ordinary skill in the relevant art may also measure other parameters such as the read margin loss and the intrinsic charge loss of the flash memory cells to determine the appropriate configuration of the voltage pulse.

Figure 3:
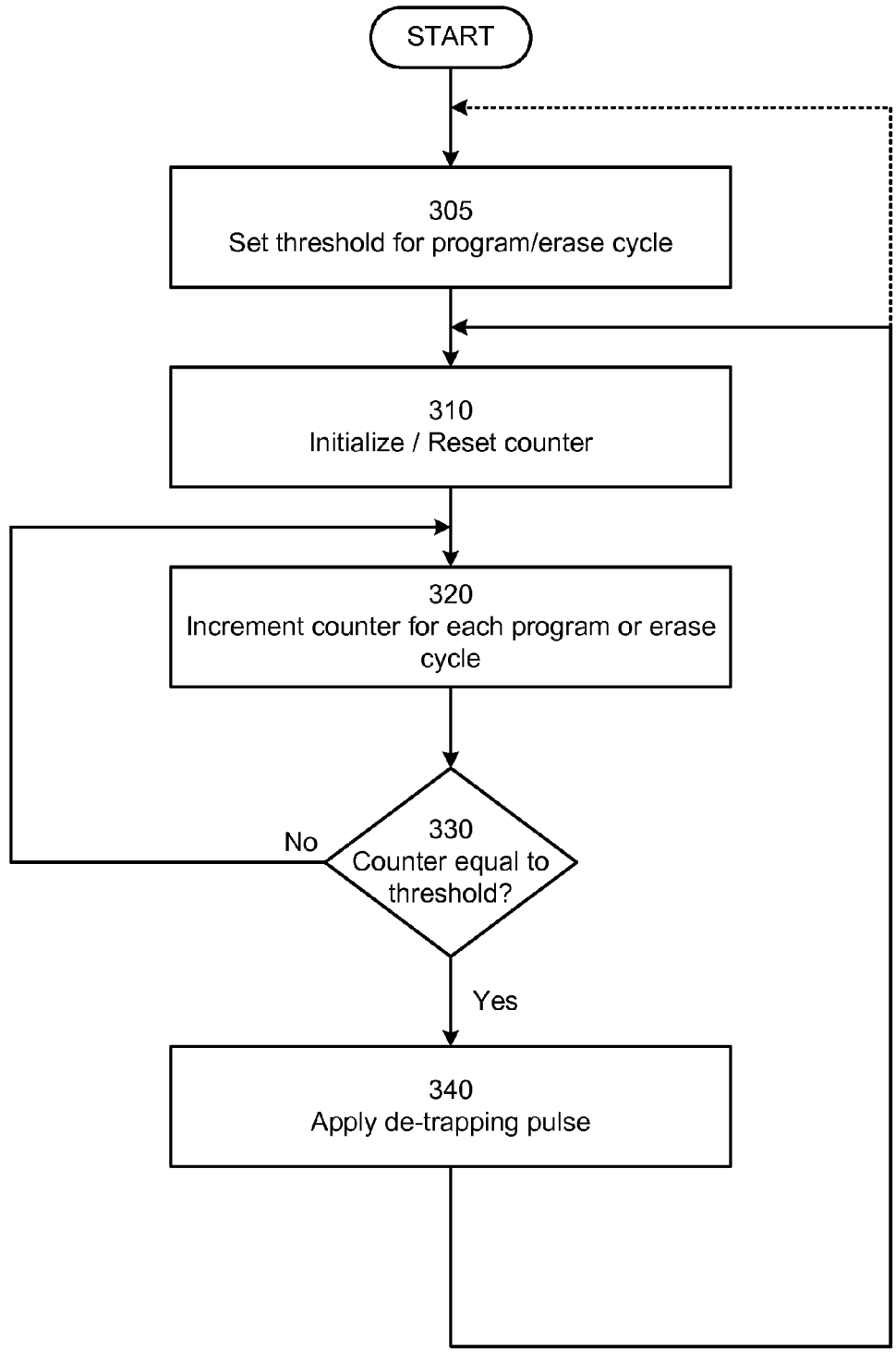
FIG. 3 illustrates a flow chart of applying a voltage pulse in accordance with one embodiment of the invention.

FIG. 3 illustrates a flow chart 300 of applying a voltage pulse in accordance with one embodiment of the invention. For clarity of illustration, FIG. 3 is discussed with reference to FIG. 1. In step 305, the controller 130 sets a threshold for the program/erase cycles of each of the memory modules 0-3 140, 142, 144, and 146. The threshold determines when one or more voltage pulses are applied to each of the memory modules 0-3 140, 142, 144, and 146 in one embodiment of the invention.

In step 310, the controller 130 initializes a counter of each of the memory modules 0-3 140, 142, 144, and 146. In step 320, the controller 130 increments the respective counter of each of the memory modules 0-3 140, 142, 144, and 146 when a programming or erasing cycle is performed on a respective one of the memory modules 0-3 140, 142, 144, and 146. For example, in one embodiment of the invention, when a programming request of the memory module 1 142 is received, the controller 130 performs the programming request and increments the counter by one count for the memory module 1 142. By doing so, the controller 130 is able to keep track of the number of programming and erasing operations of each of the memory modules 0-3 140, 142, 144, and 146.

In step 330, the controller 130 determines whether the counter for each of the memory modules 0-3 140, 142, 144, and 146 is equal to their respective set threshold. For example, in one embodiment of the invention, the threshold for the memory module 3 146 is set as two thousand in step 305. In step 330, the controller 130 checks the value of the counter for the memory module 3 146 and determines if the value of the counter is equal to the set threshold of two thousand.

If none of the counters for the memory modules 0-3 140, 142, 144 and 146 is equal to their respective set threshold, the flow 300 goes back to step 320. If any one of the counters for the memory modules 0-3 140, 142, 144 and 146 is equal to their respective set threshold, the flow 300 goes to step 340. In step 340, the controller 130 applies or enables one or more voltage pulses or de-trapping voltage pulses to the particular memory module that has a counter value equal to the set threshold. In one embodiment of the invention, step 340 is executed prior to an erasing operation of the particular memory module.

In one embodiment of the invention, after the de-trapping pulse(s) is applied, the flow 300 goes back to step 310 where the controller 130 resets the counter of the particular memory module that has a counter value equal to the set threshold. By doing so, the same threshold for the particular memory module set in step 305 is maintained.

In another embodiment of the invention, after the de-trapping pulse(s) is applied, the flow 300 goes back to step 305 where the controller 130 sets the threshold for the P/E cycles of the particular memory module that has a counter value equal to the set threshold. This allows the controller 130 to set a different threshold and allows flexibility and adaptability in the application of the de-trapping voltage. For example, in one embodiment of the invention, the threshold of a memory module may be increased after each application of the de-trapping voltage. The threshold of the memory module can be dynamically modified during the operation of the SSD in one embodiment of the invention.

The description of the flow 300 refers to a counter for each memory modules 0-3 140, 142, 144 and 146 but it is not meant to limiting. In another embodiment of the invention, each of the memory modules 0-3 140, 142, 144 and 146 has more than one flash memory die. To keep track of the P/E cycle of each flash memory die, a respective counter is maintained for each flash memory die. This allows the controller 130 to enable a voltage pulse to be applied to each of the flash memory dies in the memory modules 0-3 140, 142, 144 and 146 in one embodiment of the invention.

Figure 4:
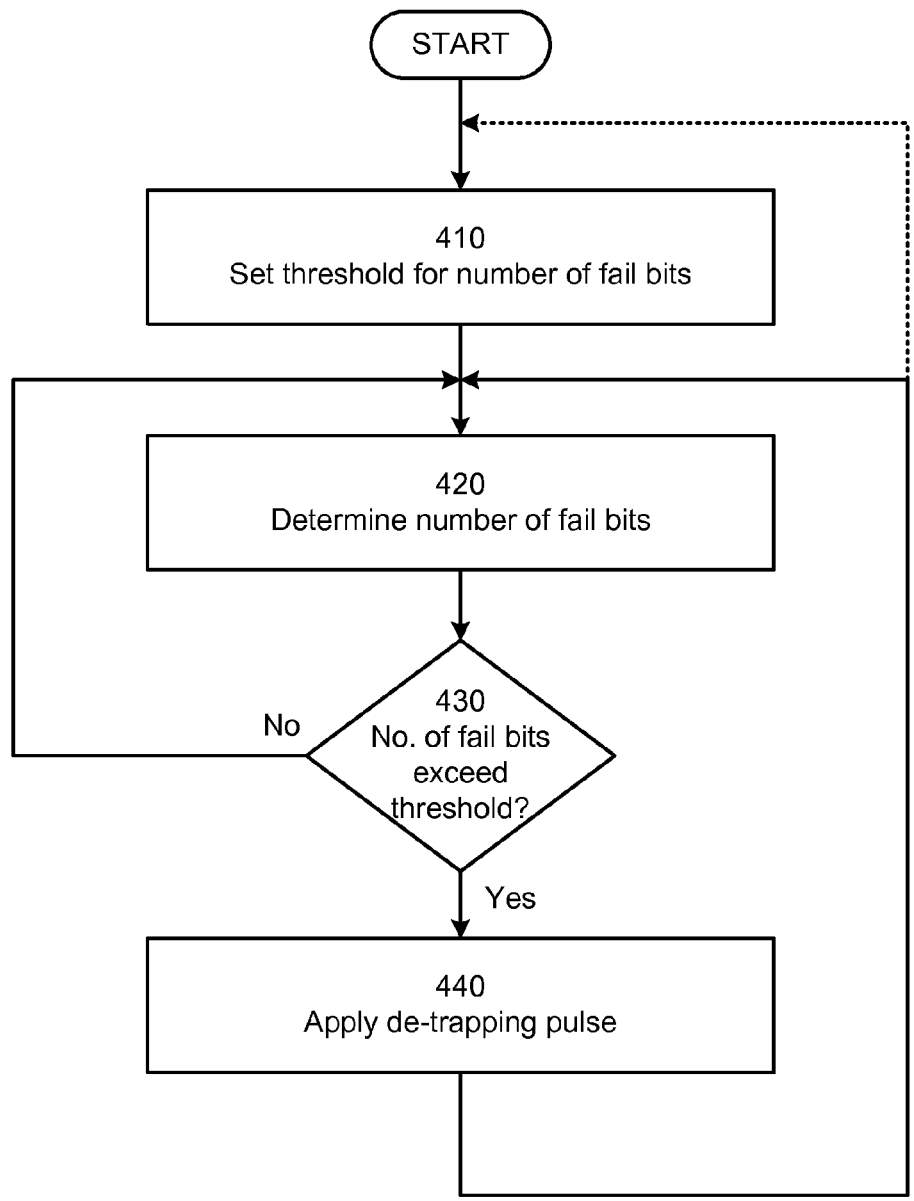
FIG. 4 illustrates a flow chart of applying a voltage pulse in accordance with one embodiment of the invention.

FIG. 4 illustrates a flow chart 400 of applying a voltage pulse in accordance with one embodiment of the invention. For clarity of illustration, FIG. 4 is discussed with reference to FIG. 1. In step 405, the controller 130 set a threshold for the number of fail bits for each of the memory modules 0-3 140, 142, 144, and 146. The threshold of the number of fail bits is the limit where the memory module has reached a certain level of P/E cycling degradation in one embodiment of the invention.

In one embodiment of the invention, the threshold of the number of fail bits is set based on an Error Correcting Code (ECC) limit of the memory modules 0-3 140, 142, 144, and 146. For example, in one embodiment of the invention, the threshold of the number of fail bits is set as 70% of the ECC limit. One of ordinary skill in the relevant art will readily appreciate that other ways of setting the threshold of fail bits can be used without affecting the workings of the invention.

In step 420, the controller 130 determines the number of fail bits for each of the memory modules 0-3 140, 142, 144, and 146. This allows the controller 130 to determine the level of P/E cycling degradation in each of the memory modules 0-3 140, 142, 144, and 146. In step 430, the controller 130 checks whether the number of fail bits for each of the memory modules 0-3 140, 142, 144, and 146 exceeds the respective threshold of the memory modules 0-3 140, 142, 144, and 146. For example, in one embodiment of the invention, the controller 130 sets the threshold of the number of fail bits for the memory module 0 140 as ten bits in step 410. In step 430, the controller 130 checks whether the number of fail bits for the memory module 0 140 exceeds ten bits.

If the number of fail bits for each of the memory modules 0-3 140, 142, 144, and 146 does not exceed the respective threshold of the memory modules 0-3 140, 142, 144, and 146, the flow 400 goes back to step 420. If the controller 130 determines that the number of fail bits for one or more of the memory modules 0-3 140, 142, 144, and 146 have exceeded their respective thresholds, the flow 400 goes to step 440. In step 440, the controller 130 applies or enables one or more voltage pulses or de-trapping voltage pulses to the particular memory module that has a number of fail bits that has exceeded its set threshold. In one embodiment of the invention, step 440 is executed prior to an erasing operation of the particular memory module.

In one embodiment of the invention, after the de-trapping pulse(s) is applied, the flow 400 goes back to step 420 where the controller 130 determines the number of fail bits for each of the memory modules 0-3 140, 142, 144, and 146. By doing so, the same threshold for the particular memory module set in step 410 is maintained.

In another embodiment of the invention, after the de-trapping pulse(s) is applied, the flow 400 goes back to step 410 where the controller 130 sets the threshold of the number of fail bits of the particular memory module that has a number of fail bits that has exceeded its set threshold. This allows the controller 130 to set a different threshold and allows flexibility and adaptability in the application of the de-trapping voltage. For example, in one embodiment of the invention, the threshold of a memory module may be increased after each application of the de-trapping voltage.

The description of the flow 400 refers to a threshold of a number of fail bits for each memory modules 0-3 140, 142, 144 and 146 but it is not meant to limiting. In another embodiment of the invention, each of the memory modules 0-3 140, 142, 144 and 146 has more than one flash memory die. The controller 130 keeps track of the number of fail bits of each flash memory die in one embodiment of the invention. This allows the controller 130 to enable a voltage pulse to be applied to each of the flash memory dies in the memory modules 0-3 140, 142, 144 and 146 in one embodiment of the invention.

The flows 300 and 400 illustrate embodiments of the invention where the controller has logic to determine when to apply one or more voltage pulses to the memory modules 0-3 140, 142, 144 and 146. In one embodiment of the invention, the flows 300 and 400 is part of, but not limited to, an erase operation, a programming operation, a separated or stand-alone operation, or any other phases of the controller. In another embodiment of the invention, the logic to determine when to apply one or more voltage pulses to the memory modules 0-3 140, 142, 144 and 146 may reside outside the controller. For example, in one embodiment of the invention, each of the memory modules 0-3 140, 142, 144 and 146 has logic to determine when to apply one or more voltage pulses to the memory modules 0-3 140, 142, 144 and 146 as described in the flow 300. In another example, in one embodiment of the invention, each of the memory modules 0-3 140, 142, 144 and 146 has logic to apply one or more voltage pulses prior to each erasing operation.

Figure 5:
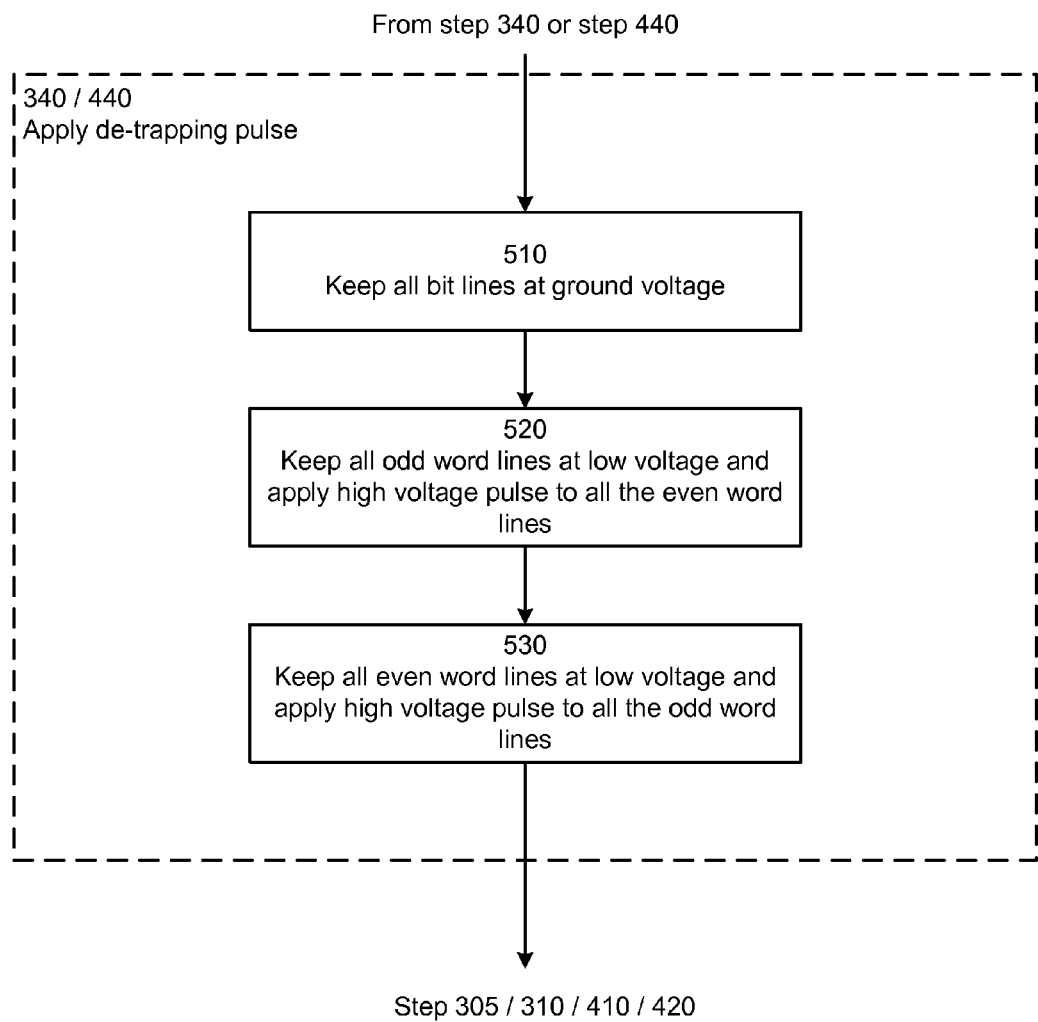
FIG. 5 illustrates a flow chart of applying a voltage pulse in accordance with one embodiment of the invention.

FIG. 5 illustrates a flow chart 500 of applying a voltage pulse in accordance with one embodiment of the invention. For clarity of illustration, FIG. 5 is discussed with reference to FIGS. 3 and 4. The flow 500 illustrates one implementation of the step 340/440 of applying the de-trapping voltage pulse.

In step 510, all the bit lines of a memory module are kept at ground or zero voltage. In one embodiment of the invention, by keeping all the bit lines at ground voltage, it can reduce any undesirable programming of the cells in the memory module while enhancing the electric field between the control gate and the active area of each cell during the application of the de-trapping voltage pulse.

In step 520, all the odd word lines of the memory module are kept at a low voltage and one or more voltage pulses are applied to all the even word lines of the memory module. In step 530, the process is reversed and all the even word lines of the memory module are kept at a low voltage and one or more voltage pulses are applied to all the odd word lines of the memory module.

In one embodiment of the invention, all the odd word lines in step 520 and all the even word lines in step 530 are kept at a voltage lower than the typical inhibit voltage value used during the programming of the memory module. By keeping the odd and even word lines at different voltage levels, this reduces the coupling among the neighboring word lines and reduces undesirable programming of the flash memory cells during the application of the de-trapping voltage pulse.

Figure 6:
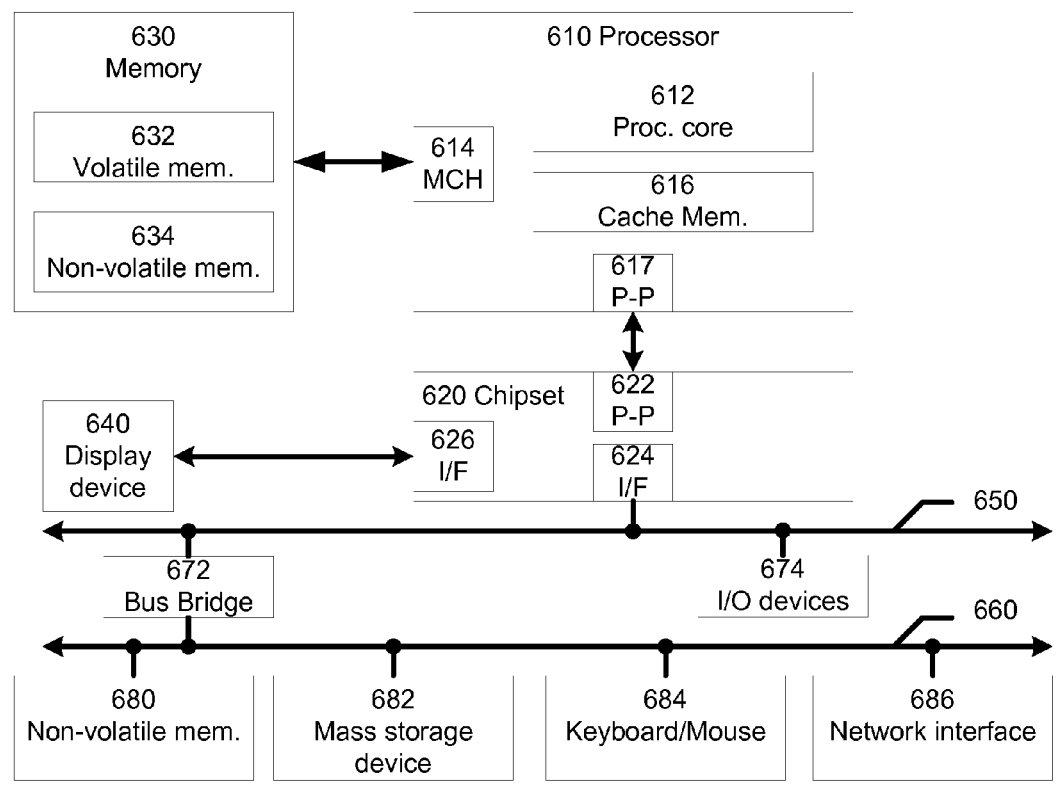
FIG. 6 illustrates a system in accordance with one embodiment of the invention.

FIG. 6 illustrates a system in accordance with one embodiment of the invention. The system 600 includes, but is not limited to, a desktop computer, a laptop computer, a netbook, a notebook computer, a personal digital assistant (PDA), a server, a workstation, a cellular telephone, a mobile computing device, an Internet appliance or any other type of computing device. In another embodiment, the system 600 used to implement the methods disclosed herein may be a system on a chip (SOC) system.

The processor 610 has a processing core 612 to execute instructions of the system 600. The processing core 612 includes, but is not limited to, pre-fetch logic to fetch instructions, decode logic to decode the instructions, execution logic to execute instructions and the like. The processor 610 has a cache memory 616 to cache instructions and/or data of the system 600. In another embodiment of the invention, the cache memory 616 includes, but is not limited to, level one, level two and level three, cache memory or any other configuration of the cache memory within the processor 610.

The memory control hub (MCH) 614 performs functions that enable the processor 610 to access and communicate with a memory 630 that includes a volatile memory 632 and/or a non-volatile memory 634. The volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 634 includes, but is not limited to, NAND flash memory, NOR flash memory, phase change memory (PCM), read only memory (ROM), electrically erasable programmable read only memory (EEPROM), or any other type of non-volatile memory device.

The memory 630 stores information and instructions to be executed by the processor 610. The memory 630 may also stores temporary variables or other intermediate information while the processor 610 is executing instructions. The chipset 620 connects with the processor 610 via Point-to-Point (PtP) interfaces 617 and 622. The chipset 620 enables the processor 610 to connect to other modules in the system 600. In one embodiment of the invention, the interfaces 617 and 622 operate in accordance with a PtP communication protocol such as the Intel® QuickPath Interconnect (QPI) or the like. The chipset 620 connects via the interface 626 to a display device 640 that includes, but is not limited to, liquid crystal display (LCD), cathode ray tube (CRT) display, or any other form of visual display device.

In addition, the chipset 620 connects via the interface 624 to one or more buses 650 and 660 that interconnect the various modules 674, 680, 682, 684, and 686. Buses 650 and 660 may be interconnected together via a bus bridge 672 if there is a mismatch in bus speed or communication protocol. The chipset 620 couples with, but is not limited to, a non-volatile memory 680, a mass storage device(s) 682, a keyboard/mouse 684 and a network interface 686. The mass storage device 682 includes, but is not limited to, a solid state drive, a hard disk drive, an universal serial bus flash memory drive, or any other form of computer data storage medium. The network interface 686 is implemented using any type of well known network interface standard including, but not limited to, an Ethernet interface, a universal serial bus (USB) interface, a Peripheral Component Interconnect (PCI) Express interface, a wireless interface and/or any other suitable type of interface. The wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although the cache memory 616 is depicted as a separate block within the processor 610, the cache memory 616 can be incorporated into the processor core 612 respectively. The system 600 may include more than one processor/processing core in another embodiment of the invention.

Although examples of the embodiments of the disclosed subject matter are described, one of ordinary skill in the relevant art will readily appreciate that many other methods of implementing the disclosed subject matter may alternatively be used. In the preceding description, various aspects of the disclosed subject matter have been described. For purposes of explanation, specific numbers, systems and configurations were set forth in order to provide a thorough understanding of the subject matter. However, it is apparent to one skilled in the relevant art having the benefit of this disclosure that the subject matter may be practiced without the specific details. In other instances, well-known features, components, or modules were omitted, simplified, combined, or split in order not to obscure the disclosed subject matter.

The term "is operable" used herein means that the device, system, protocol etc, is able to operate or is adapted to operate for its desired functionality when the device or system is in off-powered state. Various embodiments of the disclosed subject matter may be implemented in hardware, firmware, software, or combination thereof, and may be described by reference to or in conjunction with program code, such as instructions, functions, procedures, data structures, logic, application programs, design representations or formats for simulation, emulation, and fabrication of a design, which when accessed by a machine results in the machine performing tasks, defining abstract data types or low-level hardware contexts, or producing a result.

The techniques shown in the figures can be implemented using code and data stored and executed on one or more computing devices such as general purpose computers or computing devices. Such computing devices store and communicate (internally and with other computing devices over a network) code and data using machine-readable media, such as machine readable storage media (e.g., magnetic disks; optical disks; random access memory; read only memory; flash memory devices; phase-change memory) and machine readable communication media (e.g., electrical, optical, acoustical or other form of propagated signals—such as carrier waves, infrared signals, digital signals, etc.).

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope of the disclosed subject matter.

What is claimed is:

1. A method comprising:
incrementing a counter for each program operation and each erase operation of a flash memory module;
determining whether the counter is equal to a threshold value; and
applying one or more voltage pulses to a control gate of the flash memory module prior to the erase operation of the flash memory module in response to a determination that the counter is equal to the threshold value.

2. The method of claim 1, further comprising:
resetting the counter in response to applying the one or more voltage pulses to the control gate of the flash memory module prior to the erase operation of the flash memory module; and
repeating the method of incrementing, determining and applying.

3. The method of claim 2, further comprising:
setting the threshold value to another value in response to resetting the counter.

4. The method of claim 1, wherein the threshold value is a first threshold value, the method further comprising:
determining whether a number of fail bits of the flash memory module exceed a second threshold value; and
wherein applying the one or more voltage pulses to the control gate of the flash memory module prior to the erase operation of the flash memory module in response to the determination that the counter is equal to the first threshold value comprises applying the one or more voltage pulses to the control gate of the flash memory module prior to the erase operation of the flash memory module in response to the determination that the counter is equal to the first threshold value or in response to a determination that the number of fail bits of the flash memory module exceeds the second threshold value.

5. The method of claim 1, wherein applying the one or more voltage pulses to the control gate of the flash memory module prior to the erase operation of the flash memory module in response to the determination that the counter is equal to the threshold value comprises:
setting all bit lines of the flash memory module to ground voltage;
maintaining all odd word lines of the flash memory module at a voltage lower than an inhibit voltage value; and
applying the one or more voltage pulses to all even word lines of the flash memory module.

6. The method of claim 1, wherein applying the one or more voltage pulses to the control gate of the flash memory module prior to the erase operation of the flash memory module in response to the determination that the counter is equal to the threshold value comprises:
    setting all bit lines of the flash memory module to ground voltage;
    maintaining all even word lines of the flash memory module at a voltage lower than an inhibit voltage value; and
    applying the one or more voltage pulses to all odd word lines of the flash memory module.

7. An apparatus comprising:
    a plurality of flash memory modules; and
    logic coupled with the plurality of flash memory modules to:
        increment a counter for each program operation and each erase operation of each flash memory module;
        determine whether the counter is equal to a threshold value; and
        apply one or more voltage pulses to the control gate of each flash memory module prior to an erase operation of each flash memory module in response to a determination that the counter is equal to the threshold value;
        reset the counter in response to applying the one or more voltage pulses to the control gate of each flash memory module prior to the erase operation of each flash memory module; and
        repeat steps of incrementing, determining and applying.

8. The apparatus of claim 7, wherein the threshold value is a first threshold value, and wherein the logic is further to:
    determine whether a number of fail bits of the each memory module exceed a second threshold value; and
    wherein the logic to apply the one or more voltage pulses to the control gate of each flash memory module prior to the erase operation of each flash memory module in response to the determination that the counter is equal to the first threshold value is to:
    apply the one or more voltage pulses to the control gate of each flash memory module prior to the erase operation of each flash memory module in response to the determination that the counter is equal to the first threshold value or in response to a determination that the number of fail bits of the flash memory module exceeds the second threshold value.

9. The apparatus of claim 7, wherein the logic to apply the one or more voltage pulses to the control gate of each flash memory module prior to the erase operation of each flash memory module in response to the determination that the counter is equal to the threshold value is to:
    set all bit lines of each flash memory module to ground voltage;
    maintain all odd word lines of each flash memory module at a voltage lower than an inhibit voltage value; and
    apply one or more voltage pulses to all even word lines of each flash memory module.

10. The apparatus of claim 7, wherein the logic to apply the one or more voltage pulses to the control gate of each flash memory module prior to the erase operation of each flash memory module in response to the determination that the counter is equal to the threshold value is to:
    set all bit lines of each flash memory module to ground voltage;
    maintain all even word lines of each flash memory module at a voltage lower than an inhibit voltage value; and
    apply one or more voltage pulses to all odd word lines of each flash memory module.

11. The apparatus of claim 7, wherein the apparatus is a solid state drive (SSD) and wherein the logic is part of a SSD controller.

12. The apparatus of claim 7, wherein the flash memory module is one of a NAND flash memory and a NOR flash memory.

13. A system comprising:
    a processor;
    a main memory; and
    a solid state drive (SSD) comprising:
        a plurality of NAND flash memory modules; and
        a controller coupled with the plurality of flash memory modules to:
            increment a counter for each program operation and each erase operation of each NAND flash memory module;
            determine whether the counter is equal to a threshold value; and
            apply one or more voltage pulses to the control gate of each NAND flash memory module prior to an erase operation of each NAND flash memory module in response to a determination that the counter is equal to the threshold value;
            reset the counter in response to applying the one or more voltage pulses to the control gate of each NAND flash memory module prior to the erase operation of each NAND flash memory module; and
            repeat steps of incrementing, determining and applying.

14. The system of claim 13, wherein the threshold value is a first threshold value, and wherein the controller is further to:
    determine whether a number of fail bits of each NAND memory module exceed a second threshold value; and
    wherein the controller to apply the one or more voltage pulses to the control gate of each NAND flash memory module prior to the erase operation of each NAND flash memory module in response to the determination that the counter is equal to the first threshold value is to:
    apply the one or more voltage pulses to the control gate of each NAND flash memory module prior to the erase operation of each NAND flash memory module in response to the determination that the counter is equal to the first threshold value or in response to a determination that the number of fail bits of the NAND flash memory module exceeds the second threshold value.

15. The system of claim 13, wherein the controller to apply the one or more voltage pulses to the control gate of each NAND flash memory module prior to the erase operation of each NAND flash memory module in response to the determination that the counter is equal to the threshold value is to:
    set all bit lines of each NAND flash memory module to ground voltage;
    maintain all odd word lines of each NAND flash memory module at a voltage lower than an inhibit voltage value; and
    apply one or more voltage pulses to all even word lines of each NAND flash memory module.

16. The system of claim 13, wherein the controller to apply the one or more voltage pulses to the control gate of each NAND flash memory module prior to the erase operation of each NAND flash memory module in response to the determination that the counter is equal to the threshold value is to:
    set all bit lines of each NAND flash memory module to ground voltage;
    maintain all even word lines of each NAND flash memory module at a voltage lower than an inhibit voltage value; and
    apply one or more voltage pulses to all odd word lines of each NAND flash memory module.

* * * * *